US011159163B2

(12) United States Patent
Jadhav et al.

(10) Patent No.: US 11,159,163 B2
(45) Date of Patent: Oct. 26, 2021

(54) SINGLE PHASE CLOCK-GATING CIRCUIT

(71) Applicant: Synopsys, Inc., Mountain View, CA (US)

(72) Inventors: Pradip Subhana Jadhav, Bangalore (IN); John Pasternak, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/899,492

(22) Filed: Jun. 11, 2020

(65) Prior Publication Data

US 2020/0395939 A1     Dec. 17, 2020

(30) Foreign Application Priority Data

Jun. 14, 2019   (IN) .............................. 201911023567

(51) Int. Cl.
| H03K 19/00 | (2006.01) |
| H03K 19/20 | (2006.01) |
| H03K 3/012 | (2006.01) |
| H03K 19/0185 | (2006.01) |
| H03K 3/356 | (2006.01) |

(52) U.S. Cl.
CPC ......... H03K 19/0016 (2013.01); H03K 3/012 (2013.01); H03K 3/356 (2013.01); H03K 19/0013 (2013.01); H03K 19/01855 (2013.01); H03K 19/20 (2013.01)

(58) Field of Classification Search
CPC ... G11C 7/222; G11C 11/4076; G11C 29/023; G11C 29/83; H03K 19/20; H03K 19/0016; H03K 3/012; H03K 3/037; H03K 3/0375; H03K 19/0013; H03K 3/3562; H03K 19/003; H03K 3/0372; H03K 5/135; H03K 3/35625; H03K 19/0002; H03K 17/6872; H03K 19/018521; H03K 21/08; H03K 21/10; H03K 23/40; H03K 23/58; H03K 3/0233; H03K 3/356104; H03K 3/356156; H03K 5/05; H03K 5/134; G06F 1/06; G06F 2117/04
See application file for complete search history.

(56) References Cited

U.S. PATENT DOCUMENTS

| 10,587,246 B2* | 3/2020 | Kim | ................. H03K 3/356139 |
| 10,826,469 B2* | 11/2020 | Srivastava | ............. H03K 3/012 |
| 10,944,401 B1* | 3/2021 | Kim | ....................... H03K 3/037 |

* cited by examiner

*Primary Examiner* — Vibol Tan
(74) *Attorney, Agent, or Firm* — Weaver Austin Villeneuve & Sampson LLP

(57) ABSTRACT

A circuit includes three PMOS transistors (PMOS) and three NMOS transistors (NMOS). The first PMOS has a source receiving a supply voltage and a gate receiving a first signal. The second PMOS has a source coupled to a drain of the first PMOS, a gate receiving a clock signal, and a drain generating a second signal. The third PMOS has a source receiving the supply voltage, and a drain coupled to the drain of the second PMOS. The first NMOS has a drain coupled to the drain of the second PMOS, and a gate coupled to a gate of the third PMOS. The second NMOS has a gate receiving the first signal, and a drain coupled to a source of the first NMOS. The third NMOS has a gate coupled to the gate of the third PMOS transistor, and a drain coupled to the drain of the third PMOS.

12 Claims, 6 Drawing Sheets

SINGLE PHASE CLOCK-GATING CIRCUIT

CROSS REFERENCE TO RELATED APPLICATIONS

The present application claims benefit of priority of Indian Application No. 201911023567, filed Jun. 14, 2019, entitled "Novel Architecture of True Single-Phase Clock-Gating Circuit Design", the content of which is incorporated herein by reference in its entirety.

TECHNICAL FIELD

The present disclosure relates to an integrated circuit (IC), and more particularly to a clock-gating circuit used in ICs.

BACKGROUND

The increase in complexity and number of devices integrated in current generation of ICs has led to a significant increase in their power consumption. Reducing power consumption to prolong the battery life of mobile devices, such as laptops and mobile phones, remains a challenge.

The total power consumed by an IC may be defined by a sum of active power and leakage power. Active power refers to the power used while the device is performing its intended operations. Leakage power, however, refers to the power that is consumed even when the IC is not performing any operation.

SUMMARY

A circuit, in accordance with one embodiment of the present disclosure, includes, in part, three P-type Metal Oxide Semiconductor (PMOS) transistors and four N-type Metal Oxide Semiconductor (NMOS) transistors. The first PMOS transistor has a source terminal receiving a supply voltage and a gate terminal receiving a first signal. The second PMOS transistor has a source terminal coupled to a drain terminal of the first PMOS transistor, a gate terminal receiving a clock signal, and a drain terminal generating a second signal. The third PMOS transistor has a source terminal receiving the supply voltage, and a drain terminal coupled to the drain terminal of the second PMOS transistor.

The first NMOS transistor has a drain terminal coupled to the drain terminal of the second PMOS transistor, and a gate terminal coupled to a gate terminal of the third PMOS transistor. The second NMOS transistor has a gate terminal receiving the first signal, a drain terminal coupled to a source terminal of the first NMOS transistor, and a source terminal coupled to the ground terminal. The third NMOS transistor has a gate terminal receiving the clock signal, and a drain terminal coupled to the drain terminal of the second PMOS transistor. The fourth NMOS transistor has a gate terminal coupled to the gate terminals of the first NMOS transistor and the first PMOS transistor, a drain terminal coupled to a source terminal of the third NMOS transistor, and a source terminal coupled to the ground terminal.

In one embodiment, the circuit further includes, in part, a NOR gate that receives first and second control signals and generates the first signal in response. In one embodiment, the circuit further includes, in part, a NAND gate that receives the second signal and the clock signal. The NAND gate generates a third signal applied to the gate terminal of the third PMOS transistor and the gate terminals of the first and fourth NMOS transistors. In one embodiment, the circuit further includes, in part, an inverter adapted to invert the third signal to generate an output signal.

A circuit, in accordance with one embodiment of the present disclosure includes, in part, three PMOS transistors and three NMOS transistors. The first PMOS transistor has a source terminal receiving a supply voltage and a gate terminal receiving a first signal. The second PMOS transistor has a source terminal coupled to a drain terminal of the first PMOS transistor, a gate terminal receiving a clock signal, and a drain terminal generating a second signal. The third PMOS transistor has a source terminal receiving the supply voltage, and a drain terminal coupled to the drain terminal of the second PMOS transistor.

The first NMOS transistor has a drain terminal coupled to the drain terminal of the second PMOS transistor, and a gate terminal coupled to a gate terminal of the third PMOS transistor. The second NMOS transistor has a gate terminal receiving the first signal, a drain terminal coupled to a source terminal of the first NMOS transistor, and a source terminal coupled to the ground terminal. The third NMOS transistor has a gate terminal coupled to the gate terminal of the third PMOS transistor and a gate terminal of the first NMOS transistor, and a drain terminal coupled to a drain terminal of the third PMOS transistor.

In one embodiment, the circuit further includes, in part, a NOR gate that receives first and second control signals and generates the first signal in response. In one embodiment, the circuit further includes, in part, a NAND gate that receives the second signal and the clock signal and generates a third signal. The third signal is applied to the gate terminal of the third PMOS transistor and the gate terminals of the first and third NMOS transistors. The source terminal of the third NMOS transistor is coupled to the NAND gate. In one embodiment, the circuit further includes, in part, an inverter adapted to invert the third signal to generate an output signal.

A circuit, in accordance with one embodiment of the present disclosure, includes, in part, five PMOS transistors and four NMOS transistors. The first PMOS transistor has a source terminal receiving a supply voltage and a gate terminal receiving a first signal. The second PMOS transistor has a source terminal coupled to a drain terminal of the first PMOS transistor, a gate terminal receiving a clock signal, and a drain terminal generating a second signal. The third PMOS transistor has a source terminal receiving the supply voltage, and a drain terminal coupled to the drain terminal of the second PMOS transistor. The fourth PMOS transistor has a source terminal receiving the supply voltage, and a gate terminal receiving the second signal. The fifth PMOS transistor has a source terminal receiving the supply voltage, a gate terminal receiving the clock signal, and a drain terminal coupled to a gate terminal of the third PMOS transistor.

The first NMOS transistor has a drain terminal coupled to the drain terminal of the second PMOS transistor, and a gate terminal coupled to a gate terminal of the third PMOS transistor. The second NMOS transistor has a gate terminal receiving the first signal, a drain terminal coupled to a source terminal of the first NMOS transistor, and a source terminal coupled to the ground terminal. The third NMOS transistor has a gate terminal receiving the second signal, and a drain terminal coupled to a drain terminal of the fourth PMOS transistor. The fourth NMOS transistor has a gate terminal receiving the clock signal, a drain terminal coupled to a source terminal of the third NMOS transistor, and a source terminal coupled to the ground terminal.

In one embodiment, the circuit further includes, in part, a capacitor coupled between the source terminal of the second PMOS transistor and the ground terminal. In one embodiment, the circuit further includes, in part, a NOR gate that receives first and second control signals and generates the first signal in response. In one embodiment, the circuit further includes, in part, an inverter adapted to invert a signal generated at the drain terminal of the fourth PMOS transistor.

A non-transitory computer readable medium, in accordance with one embodiment of the present disclosure, includes, in part, stored instructions which when executed by a processor cause the processor to generate data representative of three PMOS transistors and four NMOS transistors. The first PMOS transistor has a source terminal receiving a supply voltage and a gate terminal receiving a first signal. The second PMOS transistor has a source terminal coupled to a drain terminal of the first PMOS transistor, a gate terminal receiving a clock signal, and a drain terminal generating a second signal. The third PMOS transistor has a source terminal receiving the supply voltage, and a drain terminal coupled to the drain terminal of the second PMOS transistor.

The first NMOS transistor has a drain terminal coupled to the drain terminal of the second PMOS transistor, and a gate terminal coupled to a gate terminal of the third PMOS transistor. The second NMOS transistor has a gate terminal receiving the first signal, a drain terminal coupled to a source terminal of the first NMOS transistor, and a source terminal coupled to the ground terminal. The third NMOS transistor has a gate terminal receiving the clock signal, and a drain terminal coupled to the drain terminal of the second PMOS transistor. The fourth NMOS transistor has a gate terminal coupled to the gate terminals of the first NMOS transistor and the first PMOS transistor, a drain terminal coupled to a source terminal of the third NMOS transistor, and a source terminal coupled to the ground terminal.

In one embodiment, the instructions further cause the processor to generate data representative of a NOR gate that receives first and second control signals and generates the first signal in response. In one embodiment, the instructions further cause the processor to generate data representative of a NAND gate that receives the second signal and the clock signal. The NAND gate generates a third signal applied to the gate terminal of the third PMOS transistor and the gate terminals of the first and fourth NMOS transistors. In one embodiment, the instructions further cause the processor to generate data representative of an inverter adapted to invert the third signal to generate an output signal.

A non-transitory computer readable medium, in accordance with one embodiment of the present disclosure, includes, in part, stored instructions which when executed by a processor cause the processor to generate data representative of three PMOS transistors and three NMOS transistors. The first PMOS transistor has a source terminal receiving a supply voltage and a gate terminal receiving a first signal. The second PMOS transistor has a source terminal coupled to a drain terminal of the first PMOS transistor, a gate terminal receiving a clock signal, and a drain terminal generating a second signal. The third PMOS transistor has a source terminal receiving the supply voltage, and a drain terminal coupled to the drain terminal of the second PMOS transistor.

The first NMOS transistor has a drain terminal coupled to the drain terminal of the second PMOS transistor, and a gate terminal coupled to a gate terminal of the third PMOS transistor. The second NMOS transistor has a gate terminal receiving the first signal, a drain terminal coupled to a source terminal of the first NMOS transistor, and a source terminal coupled to the ground terminal. The third NMOS transistor has a gate terminal coupled to the gate terminal of the third PMOS transistor and a gate terminal of the first NMOS transistor, and a drain terminal coupled to a drain terminal of the third PMOS transistor.

In one embodiment, the instructions further cause the processor to generate data representative of a NOR gate that receives first and second control signals and generates the first signal in response. In one embodiment, the instructions further cause the processor to generate data representative of a NAND gate that receives the second signal and the clock signal and generates a third signal. The third signal is applied to the gate terminal of the third PMOS transistor and the gate terminals of the first and third NMOS transistors. The source terminal of the third NMOS transistor is coupled to the NAND gate. In one embodiment, the instructions further cause the processor to generate data representative of an inverter adapted to invert the third signal to generate an output signal.

A non-transitory computer readable medium, in accordance with one embodiment of the present disclosure, includes, in part, stored instructions which when executed by a processor cause the processor to generate data representative of five PMOS transistors and four NMOS transistors. The first PMOS transistor has a source terminal receiving a supply voltage and a gate terminal receiving a first signal. The second PMOS transistor has a source terminal coupled to a drain terminal of the first PMOS transistor, a gate terminal receiving a clock signal, and a drain terminal generating a second signal. The third PMOS transistor has a source terminal receiving the supply voltage, and a drain terminal coupled to the drain terminal of the second PMOS transistor. The fourth PMOS transistor has a source terminal receiving the supply voltage, and a gate terminal receiving the second signal. The fifth PMOS transistor has a source terminal receiving the supply voltage, a gate terminal receiving the clock signal, and a drain terminal coupled to a gate terminal of the third PMOS transistor.

The first NMOS transistor has a drain terminal coupled to the drain terminal of the second PMOS transistor, and a gate terminal coupled to a gate terminal of the third PMOS transistor. The second NMOS transistor has a gate terminal receiving the first signal, a drain terminal coupled to a source terminal of the first NMOS transistor, and a source terminal coupled to the ground terminal. The third NMOS transistor has a gate terminal receiving the second signal, and a drain terminal coupled to a drain terminal of the fourth PMOS transistor. The fourth NMOS transistor has a gate terminal receiving the clock signal, a drain terminal coupled to a source terminal of the third NMOS transistor, and a source terminal coupled to the ground terminal.

In one embodiment, the instructions further cause the processor to generate data representative of a capacitor coupled between the source terminal of the second PMOS transistor and the ground terminal. In one embodiment, the instructions further cause the processor to generate data representative of a NOR gate that receives first and second control signals and generates the first signal in response. In one embodiment, the instructions further cause the processor to generate data representative of an inverter adapted to invert a signal generated at the drain terminal of the fourth PMOS transistor.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

A single-phase clock gating circuit, in accordance with embodiments of the present disclosure, has relatively few transistors and relatively small clock pin capacitance and thus has substantially reduced power consumption.

Figure 1:
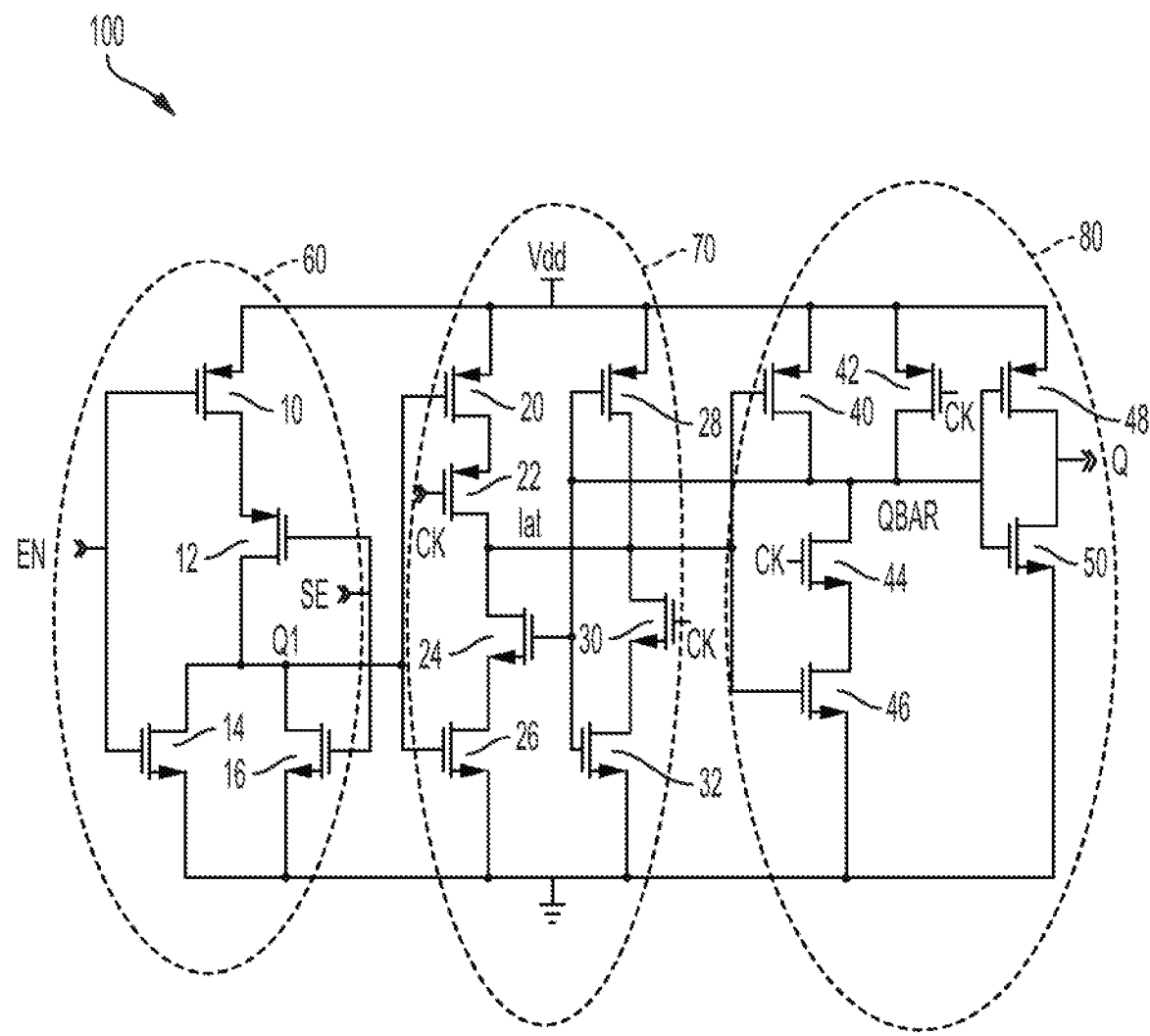
FIG. 1 is a simplified transistor schematic diagram of a clock gating circuit, in accordance with one embodiment of the present disclosure.

FIG. 1 is a transistor schematic diagram of a clock gating circuit 100, in accordance with one embodiment of the present disclosure. Clock gating circuit 100 is shown as including, in part, an input stage 60, a latch 70, and an output stage 80. Clock gating circuit 100 is adapted to receive input control signals enable (EN), Set (SE), and clock signal CK. In response to the input control signals EN and SE, clock gating circuit 100 latches the clock signal CK to generate output signal Q.

Input stage 60 is shown as including, PMOS transistors 10, 12, and NMOS transistors 14, 16. Transistors 10, 12, 14 and 16 form a NOR gate that receives input signals EN and SE and generates an internal signal $O_1$.

Latch 70 includes PMOS transistors 20, 22, 28 and NMOS transistors 24, 26, 30 and 32. Latch 70 is shown as receiving signal $O_1$ at the gate terminals of transistors 20, 26, as well as clock signal CK at the gate terminals of transistors 22, 30, to generate internal signal Lat at the drain terminals of transistors 22 and 28.

Output stage 60 is shown as including, PMOS transistors 40, 42, 48, and NMOS transistors 44, 46, 50. Transistors 40, 42, 44 and 46 form a NAND gate that receives signals Lat and CK, and generates internal signal QBAR. Transistors 48, 50 form an inverter that inverts signal QBAR to generate output signal Q of clock gating circuit 100.

Signals EN and SE are used to gate clock signal CK. To initialize circuit 100, enable signal EN is set to a high logic level (high). This causes transistor 14 to turn on, in turn causing signal $O_1$ to go low. When signal CK is also low, signal Lat at the drain terminal of transistor 22 increases to the $V_{cc}$ voltage (high logic level or high) through transistors 20, 22. Concurrently when signal CK is low, signal QBAR increases to the $V_{cc}$ voltage through transistors 42, in turn causing output signal Q of circuit 100 to decrease to the ground potential (low logic level or low) via transistor 50 of output stage 80.

If the clock signal CK makes a transition to a high logic level while signal EN remains high, because signal Lat was previously high, signal QBAR is pulled low through transistors 44 and 46. The low level of signal QBAR causes transistor 28 to turn on to maintain signal Lat at a high level.

During the latching operation, signals EN and SE are both set to a logic low level thereby causing signal $O_1$ to increase to the $V_{cc}$ voltage through transistors 10 and 12. When signal CK is low, transistor 42 turns on thus causing signal QBAR to increase to $V_{cc}$ voltage. Because both signals QBAR and $O_1$ are high, transistors 24 and 26 turn on causing signal Lat to decrease to the ground potential. The low voltage level of signal Lat, in turn, turns transistor 40 on to further maintain signal QBAR at $V_{cc}$ voltage level.

When signal CK makes a low-to-high transition, transistor 30 turns on. Because signal QBAR was at a high level, transistor 32 also remains on. Accordingly, a path to ground is formed through transistors 30 and 32 to maintain signal Lat at the ground potential. Furthermore, because signals $O_1$ and QBAR are high, transistors 24 and 26 are also on, thereby providing a second discharge path for signal Lat to the ground potential. The low voltage of signal Lat keeps transistor 40 on thus maintaining QBAR at the high voltage and signal Q at a low voltage.

Figure 2:
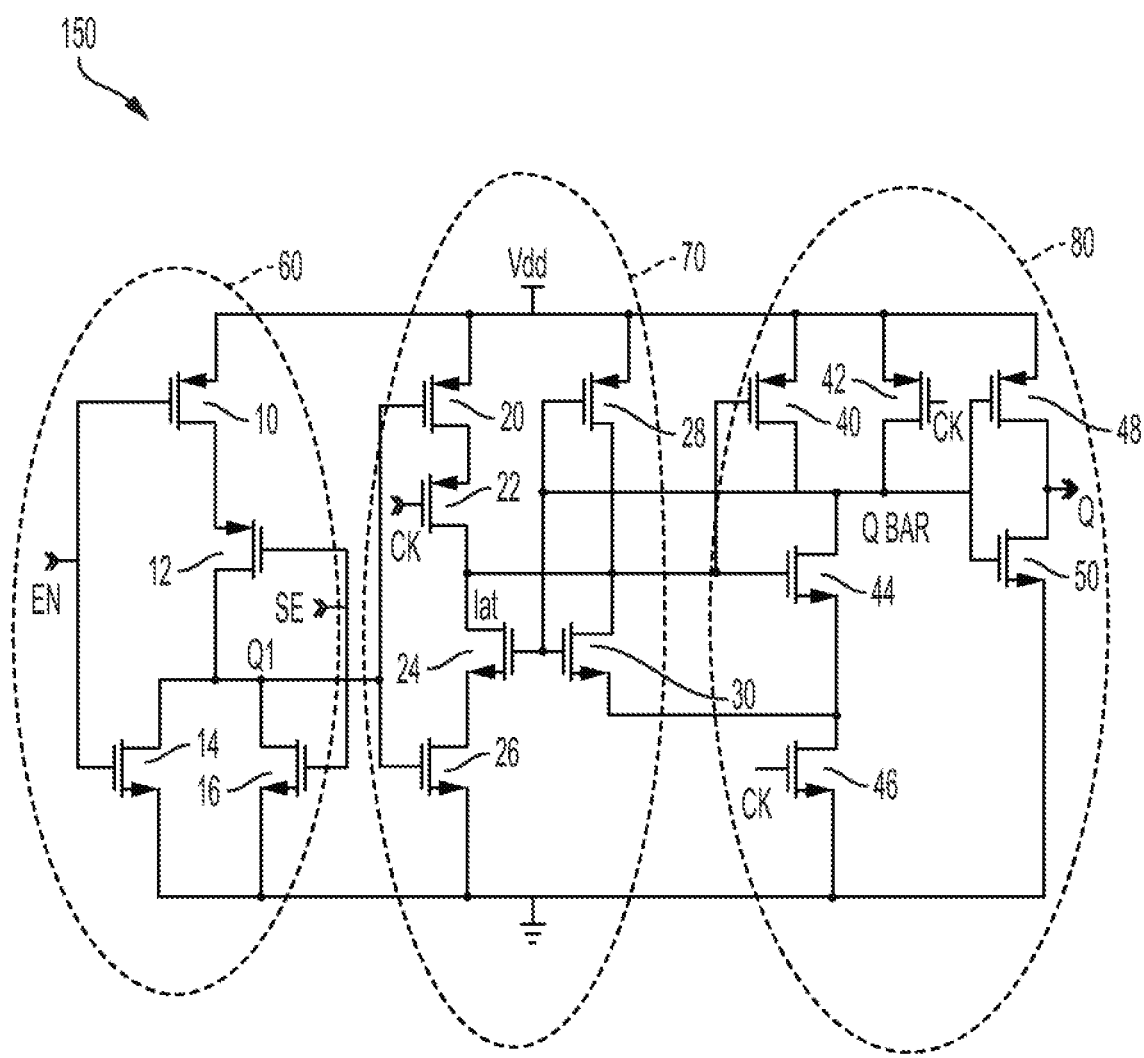
FIG. 2 is a simplified transistor schematic diagram of a clock gating circuit, in accordance with one embodiment of the present disclosure.

FIG. 2 is a transistor schematic diagram of a clock gating circuit 150, in accordance with another embodiment of the present disclosure. Clock gating circuit 150 is shown as including, in part, an input stage 60, a latch 70, and an output stage 80. Clock gating circuit 150 is adapted to receive input control signals EN, SE, and clock signal CK. In response to the input control signals EN and SE, clock gating circuit 150 latches clock signal CK to generate output signal Q.

Input stage 60 is shown as including, PMOS transistors 10, 12, and NMOS transistors 14, 16. Transistors 10, 12, 14 and 16 form a NOR gate that receives input signals EN and SE and generates internal signal $O_1$.

Latch 70 includes PMOS transistors 20, 22, 28 and NMOS transistors 24, 26, 30. Latch 70 is shown as receiving signal $O_1$ at the gate terminals of transistors 20, 26, as well as clock signal CK at the gate terminal of transistor 22, and generate internal signal Lat at the drain terminals of transistors 22 and 24.

Output stage 60 is shown as including, PMOS transistors 40, 42, 48, and NMOS transistors 44, 46, 50. Transistors 40, 42, 44 and 46 form a NAND gate that receives signals Lat and CK, and generates output signal QBAR. Transistors 48, 50 form an inverter that inverts signal QBAR to generate output signal Q of clock gating circuit 150.

Signals EN and SE are used to gate the clock signal CK. To initialize circuit 150, enable signal EN is set to a high logic level. This causes transistor 14 to turn on, in turn causing signal $O_1$ to go low. When signal CK is also low, signal Lat at the drain terminal of transistor 22 is increased to the Vcc voltage through transistors 20, 22. Concurrently when signal CK is low, signal QBAR increases to the Vcc voltage through transistor 42, in turn causing output signal Q of circuit 100 to be pulled to the ground potential via transistor 50 of output stage 80.

If the clock signal CK makes a transition to a high logic level while signal EN remains high, because signal Lat was also previously high, signal QBAR is pulled low through transistors 44 and 46. The low level of signal QBAR causes transistor 28 to turn on and maintain signal Lat at a high level.

During the latching operation, signals EN and SE are both set to a logic low level thereby causing signal $O_1$ to increase to the Vcc voltage through transistors 10 and 12. When signal CK is low, transistor 42 turns on thus causing signal QBAR to increase to the Vcc voltage. Because both signals QBAR and $O_1$ are high, transistors 24 and 26 turn on causing signal Lat to decrease to the ground potential. The low voltage level of signal Lat also turns transistor 40 on to further maintain signal QBAR at the Vcc voltage level.

When signal CK makes a low-to-high transition, transistor 46 turns on. Because signal QBAR was at a high level, transistor 30 also remains on. Accordingly, a path to ground is formed through transistors 30 and 46 to maintain signal Lat at the ground potential. Furthermore, because signals O1 and QBAR are high, transistors 24 and 26 are also on providing a second discharge path for signal Lat to the ground potential. The low voltage of signal Lat keeps transistor 40 on thus maintaining QBAR at the high voltage.

Figure 3:
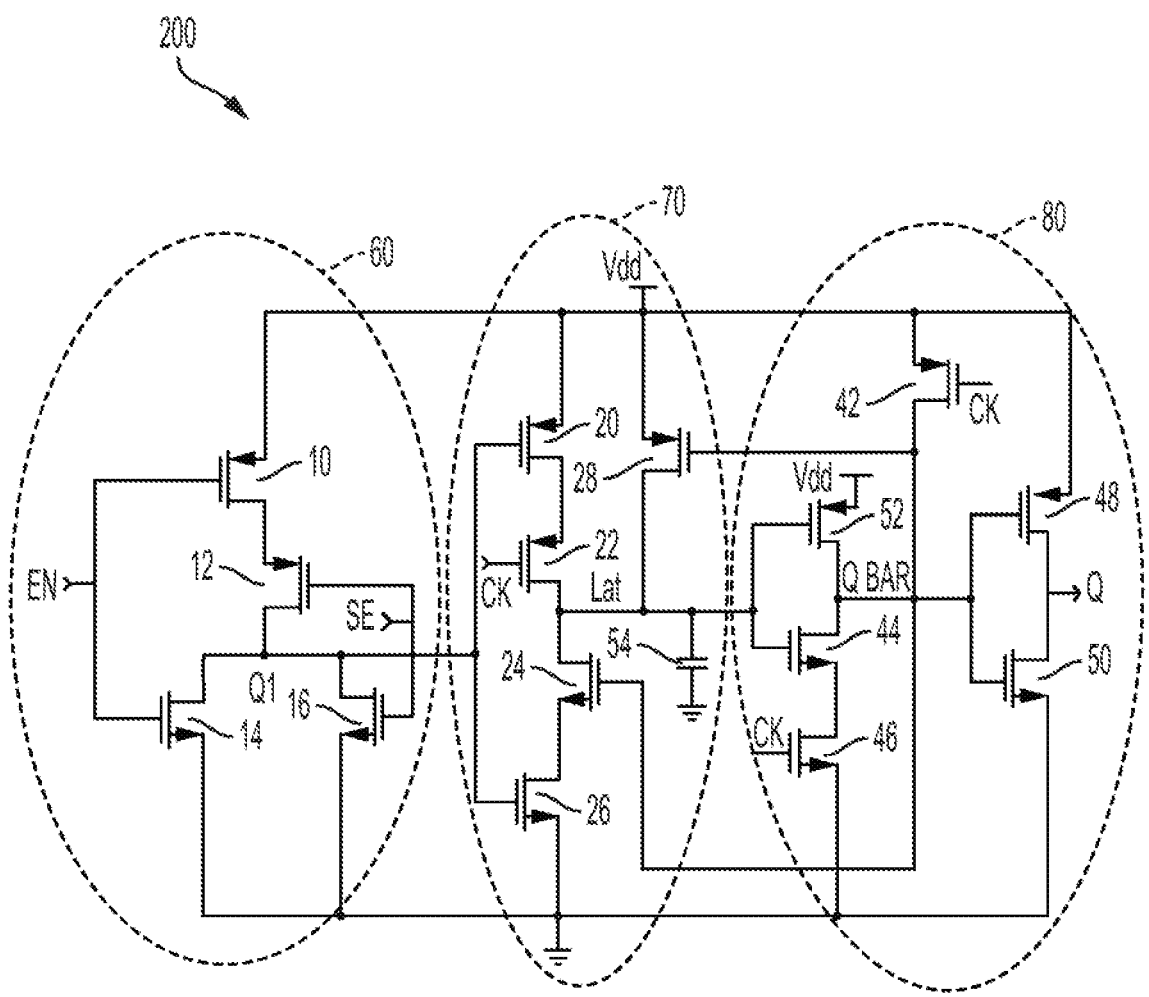
FIG. 3 is a simplified transistor schematic diagram of a clock gating circuit, in accordance with one embodiment of the present disclosure.

FIG. 3 is a transistor schematic diagram of a clock gating circuit 200, in accordance with another embodiment of the present disclosure. Clock gating circuit 200 is shown as including, in part, an input stage 60, a latch 70, and an output stage 80. Clock gating circuit 200 is adapted to receive input control signals EN, SE, and clock signal CK. In response to the input control signals EN and SE, clock gating circuit 200 latches the clock signal to generate output signal Q.

Input stage 60 is shown as including, PMOS transistors 10, 12, and NMOS transistors 14, 16. Transistors 10, 12, 14 and 16 form a NOR gate that receives input signals EN and SE and generates an internal signal $O_1$.

Latch 70 includes PMOS transistors 20, 22, 28, NMOS transistors 24, 26, and capacitor 54. Latch 70 is shown as receiving signal $O_1$ at the gate terminals of transistors 20, 26, as well as clock signal CK at the gate terminal of transistor 22, and generate internal signal Lat at the drain terminals of transistors 22 and 24.

Output stage 80 is shown as including PMOS transistors 52, 42, 48, and NMOS transistors 44, 46, 50. Output stage 80 receives signals Lat and CK, and generates, in part, internal signal QBAR. Transistors 48, 50 form an inverter that inverts signal QBAR to generate output signal Q of clock gating circuit 200.

Signals EN and SE are used to gate the clock signal CK. To initialize circuit 200, enable signal EN is set to a high logic level. This causes transistor 14 to turn on, in turn causing signal $O_1$ to go low. When signal CK is also low, signal Lat at the drain terminal of transistor 22 is increased to the Vcc voltage through transistors 20 and 22. Concurrently when signal CK is low, signal QBAR is increased to the Vcc voltage through transistor 42, in turn causing output signal Q of circuit 100 to be pulled to the ground potential via transistor 50 of output stage 80.

If the clock signal CK makes a transition to a high logic level while signal EN remains high, because signal Lat was also previously high, signal QBAR is pulled low through transistors 44 and 46. The low level of signal QBAR causes transistor 28 to turn on and maintain signal Lat at a high level.

During the latching operation, signals EN and SE are both set to a low logic level thereby causing signal $O_1$ to increase to the Vcc voltage through transistors 10 and 12. When signal CK is low, transistor 42 turns on thus causing signal QBAR to increase to the Vcc voltage. Because both signals QBAR and $O_1$ are high, transistors 24 and 26 turn on causing signal Lat to be discharged to the ground potential. The low voltage level of signal Lat also turns transistor 52 on to further maintain signal QBAR at the Vcc voltage level.

When signal CK makes a low-to-high transition, because both signals $O_1$ and QBAR were at a high level, transistors 24 and 26 are on to maintain signal Lat at the ground potential. The low voltage of signal Lat keeps transistor 52 on thus maintaining QBAR at the high voltage. Capacitor 54 is adapted to maintain the voltage of signal Lat during signal transitions.

Figure 4:
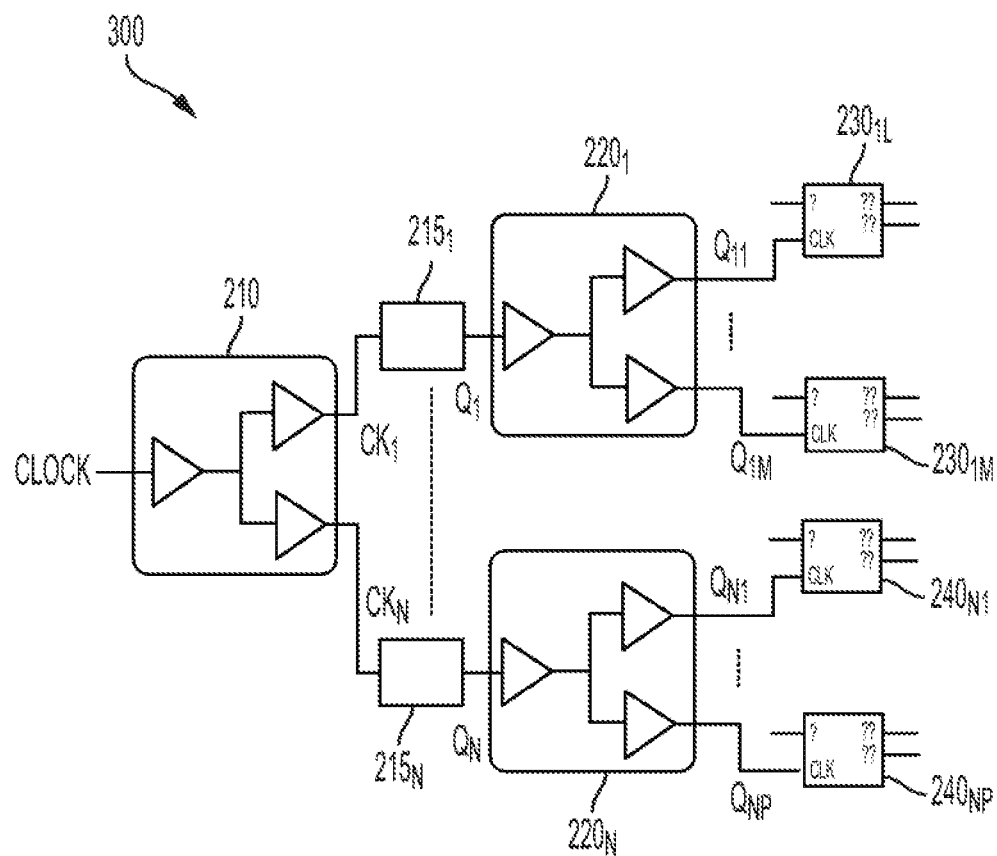
FIG. 4 is a schematic diagram of a clock distribution network which uses a clock gating circuit, in accordance with one embodiment of the present disclosure.

FIG. 4 is a schematic diagram of a clock distribution circuit 300, in accordance with one embodiment of the present disclosure. Clock distribution circuit 300 is shown as including, in part, a primary clock tree 210 that is coupled to N secondary clock trees $220_i$ (i is an integer ranging from 1 to N) via N clock gating circuit 215. Each clock gating circuit 215 corresponds to one of the clock gating circuits 100, 150 or 200 described above.

As is shown, primary clock tree receives clock signal CLOCK and generates N clock signals $CK_i$ each applied to an associated clock gating circuit $215_i$. In response, each clock gating circuit $215_i$ generates an output signal $Q_i$. The output signal $Q_i$ of clock gating circuit $215_i$ is received by an associated secondary clock tree $220_i$, which in response, generates a multitude of the clock signals. For example, secondary clock tree $220_1$ is shown as receiving signal $Q_1$ from clock gating circuit $215_1$ and generating M clock signals $Q_{11}, Q_{12} \ldots Q_{1M}$ each of which is shown as being applied to a clock input terminal of an associated flip-flop $230_{ij}$, where j in an index ranging from 1 to M. Similarly, secondary clock tree $220_N$ is shown as receiving signal $Q_N$ from clock gating circuit $215_N$ and generating P clock signals $Q_{N1}, Q_{N2} \ldots Q_{NP}$ each of which is shown as being applied to a clock input terminal of an associated flip-flop $240_{ik}$, where k in an index ranging from 1 to P.

A clock gating circuit, in accordance with embodiments of the present disclosure, uses fewer transistors and is adapted to provides significant advantages relative to conventional clock gating circuits. In one example, a clock gating circuit, in accordance with embodiments of the present disclosure, consumes 18% less leakage current and 50% less dynamic power. Furthermore, to the extent that a clock gating circuit, in accordance with embodiments of the present disclosure, does not include a clock buffer, the clock gating circuit consumes 25% less power than conventional clock gating circuits when either enable signal EN or the set signal SE is not asserted. Moreover, because the clock gating circuit, in accordance with embodiments of the present disclosure, has fewer transistors, the clock gating circuit consumes 14% less silicon area for any given processing node.

Figure 5:
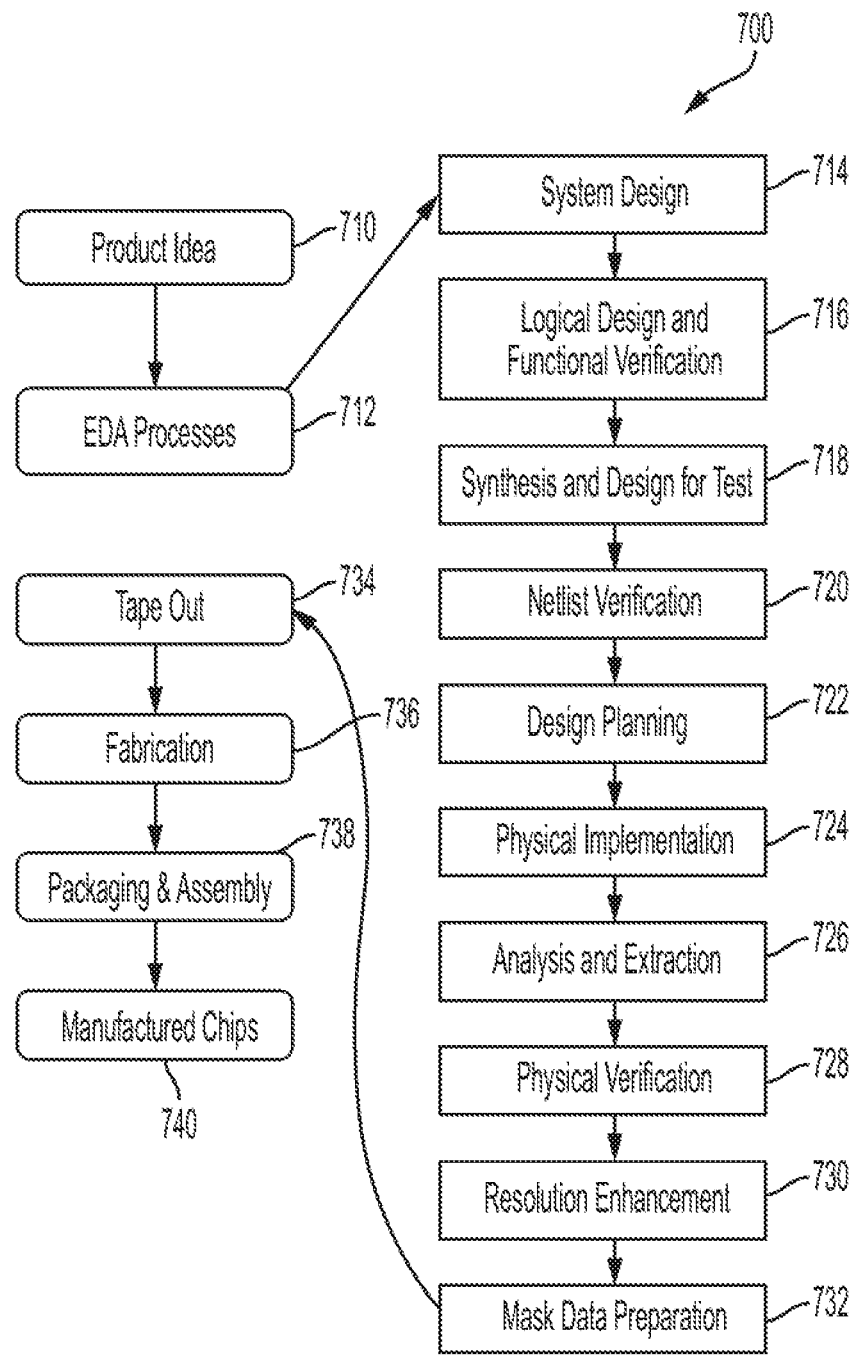
FIG. 5 is a flowchart of various processes used during the design and manufacture of an integrated circuit, in accordance with some embodiments of the present disclosure.

FIG. 5 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 7. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 900 of FIG. 6) may be used to store the programs and data structures that are used by some or all of the EDA products described herein, and products used for development of cells for the library and for physical and logical design that use the library.

Figure 6:
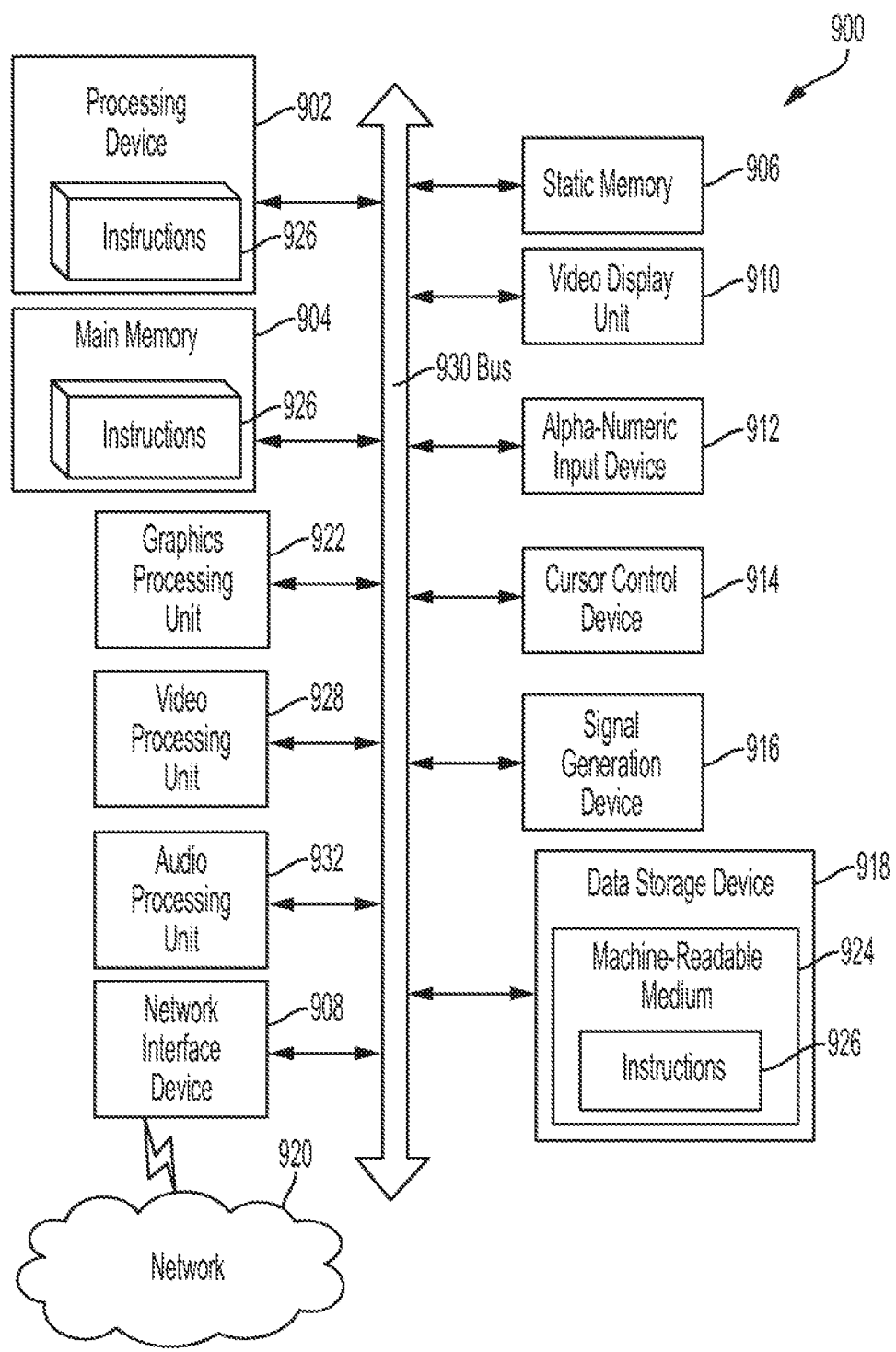
FIG. 6 is abstract diagram of an exemplary computer system in which embodiments of the present disclosure may operate.

FIG. 6 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A circuit comprising:
   a first PMOS transistor having a source terminal receiving a supply voltage and a gate terminal receiving a first signal;
   a second PMOS transistor having a source terminal coupled to a drain terminal of the first PMOS transistor, a gate terminal receiving a clock signal, and a drain terminal generating a second signal;
   a third PMOS transistor having a source terminal receiving the supply voltage, and a drain terminal coupled to the drain terminal of the second PMOS transistor;
   a first NMOS transistor having a drain terminal coupled to the drain terminal of the second PMOS transistor, and a gate terminal coupled to a gate terminal of the third PMOS transistor;
   a second NMOS transistor having a gate terminal receiving the first signal, a drain terminal coupled to a source terminal of the first NMOS transistor, and a source terminal coupled to a ground terminal;

a third NMOS transistor having a gate terminal receiving the clock signal, and a drain terminal coupled to the drain terminal of the second PMOS transistor; and a fourth NMOS transistor having a gate terminal coupled to the gate terminals of the first NMOS transistor and the first PMOS transistor, a drain terminal coupled to a source terminal of the third NMOS transistor, and a source terminal coupled to the ground terminal.

2. The circuit of claim 1 further comprising:
one or more gates performing a NOR function, said one or more gates adapted to receive first and second control signals and generate the first signal in response.

3. The circuit of claim 2 further comprising:
one or more gates performing a NAND function, said one or more gates performing the NAND function adapted to receive the second signal and the clock signal and generate a third signal applied to the gate terminal of the third PMOS transistor and the gate terminals of the first and fourth NMOS transistors.

4. The circuit of claim 3 further comprising:
an inverter adapted to invert the third signal to generate an output signal.

5. A circuit comprising:
a first PMOS transistor having a source terminal receiving a supply voltage and a gate terminal receiving a first signal;
a second PMOS transistor having a source terminal coupled to a drain terminal of the first PMOS transistor, a gate terminal receiving a clock signal, and a drain terminal generating a second signal;
a third PMOS transistor having a source terminal receiving the supply voltage, and a drain terminal coupled to the drain terminal of the second PMOS transistor;
a first NMOS transistor having a drain terminal coupled to the drain terminal of the second PMOS transistor, and a gate terminal coupled to a gate terminal of the third PMOS transistor;
a second NMOS transistor having a gate terminal receiving the first signal, a drain terminal coupled to a source terminal of the first NMOS transistor, and a source terminal coupled to a ground terminal; and
a third NMOS transistor having a gate terminal coupled to the gate terminal of the third PMOS transistor and a gate terminal of the first NMOS transistor, and a drain terminal coupled to a drain terminal of the third PMOS transistor.

6. The circuit of claim 5 further comprising:
one or more gates performing a NOR function, said one or more gates adapted to receive first and second control signals and generate the first signal in response.

7. The circuit of claim 6 further comprising:
one or more gates performing a NAND function, said one or more gates performing the NAND function adapted to receive the second signal and the clock signal and generate a third signal applied to the gate terminal of the third PMOS transistor and the gate terminals of the first and third NMOS transistors, wherein the source terminal of the third NMOS transistor is coupled to the NAND gate.

8. The circuit of claim 7 further comprising:
an inverter adapted to invert the third signal to generate an output signal.

9. A circuit comprising:
a first PMOS transistor having a source terminal receiving a supply voltage and a gate terminal receiving a first signal;
a second PMOS transistor having a source terminal coupled to a drain terminal of the first PMOS transistor, a gate terminal receiving a clock signal, and a drain terminal generating a second signal;
a third PMOS transistor having a source terminal receiving the supply voltage, and a drain terminal coupled to the drain terminal of the second PMOS transistor;
a fourth PMOS transistor having a source terminal receiving the supply voltage, and a gate terminal receiving the second signal,
a fifth PMOS transistor having a source terminal receiving the supply voltage, a gate terminal receiving the clock signal, and a drain terminal coupled to a gate terminal of the third PMOS transistor;
a first NMOS transistor having a drain terminal coupled to the drain terminal of the second PMOS transistor, and a gate terminal coupled to a gate terminal of the third PMOS transistor;
a second NMOS transistor having a gate terminal receiving the first signal, a drain terminal coupled to a source terminal of the first NMOS transistor, and a source terminal coupled to a ground terminal;
a third NMOS transistor having a gate terminal receiving the second signal, and a drain terminal coupled to a drain terminal of the fourth PMOS transistor; and
a fourth NMOS transistor having a gate terminal receiving the clock signal, a drain terminal coupled to a source terminal of the third NMOS transistor, and a source terminal coupled to the ground terminal.

10. The circuit of claim 9 further comprising:
a capacitor coupled between the source terminal of the second PMOS transistor and the ground terminal.

11. The circuit of claim 10 further comprising:
one or more gates performing a NOR function, said one or more gates adapted to receive first and second control signals and generate the first signal in response.

12. The circuit of claim 11 further comprising:
an inverter adapted to invert a signal generated at the drain terminal of the fourth PMOS transistor.

* * * * *